United States Patent
Foxall

(10) Patent No.: US 9,989,606 B2
(45) Date of Patent: Jun. 5, 2018

(54) MULTIPLE SHOT MAGNETIC RESONANCE IMAGING WITH GHOSTING STABILITY CORRECTION

(71) Applicant: KONINKLIJKE PHILIPS N.V., Eindhoven (NL)

(72) Inventor: David Leslie Foxall, Mentor, OH (US)

(73) Assignee: Koninklijke Philips N.V., Eindhoven (NL)

( * ) Notice: Subject to any disclaimer, the term of this patent is extended or adjusted under 35 U.S.C. 154(b) by 484 days.

(21) Appl. No.: 14/419,548

(22) PCT Filed: Jul. 29, 2013

(86) PCT No.: PCT/IB2013/056189
§ 371 (c)(1),
(2) Date: Feb. 4, 2015

(87) PCT Pub. No.: WO2014/024085
PCT Pub. Date: Feb. 13, 2014

(65) Prior Publication Data
US 2015/0177349 A1  Jun. 25, 2015

Related U.S. Application Data

(60) Provisional application No. 61/680,879, filed on Aug. 8, 2012.

(51) Int. Cl.
*G01R 33/48* (2006.01)
*G01R 33/565* (2006.01)
*G01R 33/561* (2006.01)

(52) U.S. Cl.
CPC ..... *G01R 33/4806* (2013.01); *G01R 33/4818* (2013.01); *G01R 33/561* (2013.01); *G01R 33/56554* (2013.01); *G01R 33/5659* (2013.01)

(58) Field of Classification Search
CPC ............ G01R 33/4806; G01R 33/4818; G01R 33/561; G01R 33/56554; G01R 33/5659
See application file for complete search history.

(56) References Cited

U.S. PATENT DOCUMENTS 6,249,595 B1   6/2001   Foxall
6,259,250 B1   7/2001   Mock
(Continued)

FOREIGN PATENT DOCUMENTS

CN   101915901 A   12/2010
JP   08280649 A    10/1996
(Continued)

OTHER PUBLICATIONS

Kang, D.H. et al "A Correction of Amplitude Variation using Navigators in an Interleave-Type Multi-Shot EPI at 7T", Proceedings of the International Society for Magnetic Resonance in Medicine, May 2011.
(Continued)

*Primary Examiner* — Rodney Bonnette

(57) ABSTRACT

An image dataset comprises multiple shots of imaging data acquired using a magnetic resonance imaging (MRI) scanner (10). The signal power of each shot of the image dataset is normalized (24) to a reference signal power to generate a power normalized shot representation having total signal power matching the reference signal power. A reconstructed image is generated (26) from the power normalized shot representations. Odd/even phase correction (22) may also be performed on the image dataset. The phase correction, normalizing, and generating operations are suitably performed by an electronic data processing device (20).

21 Claims, 3 Drawing Sheets

(56) References Cited

U.S. PATENT DOCUMENTS

Figure 1:
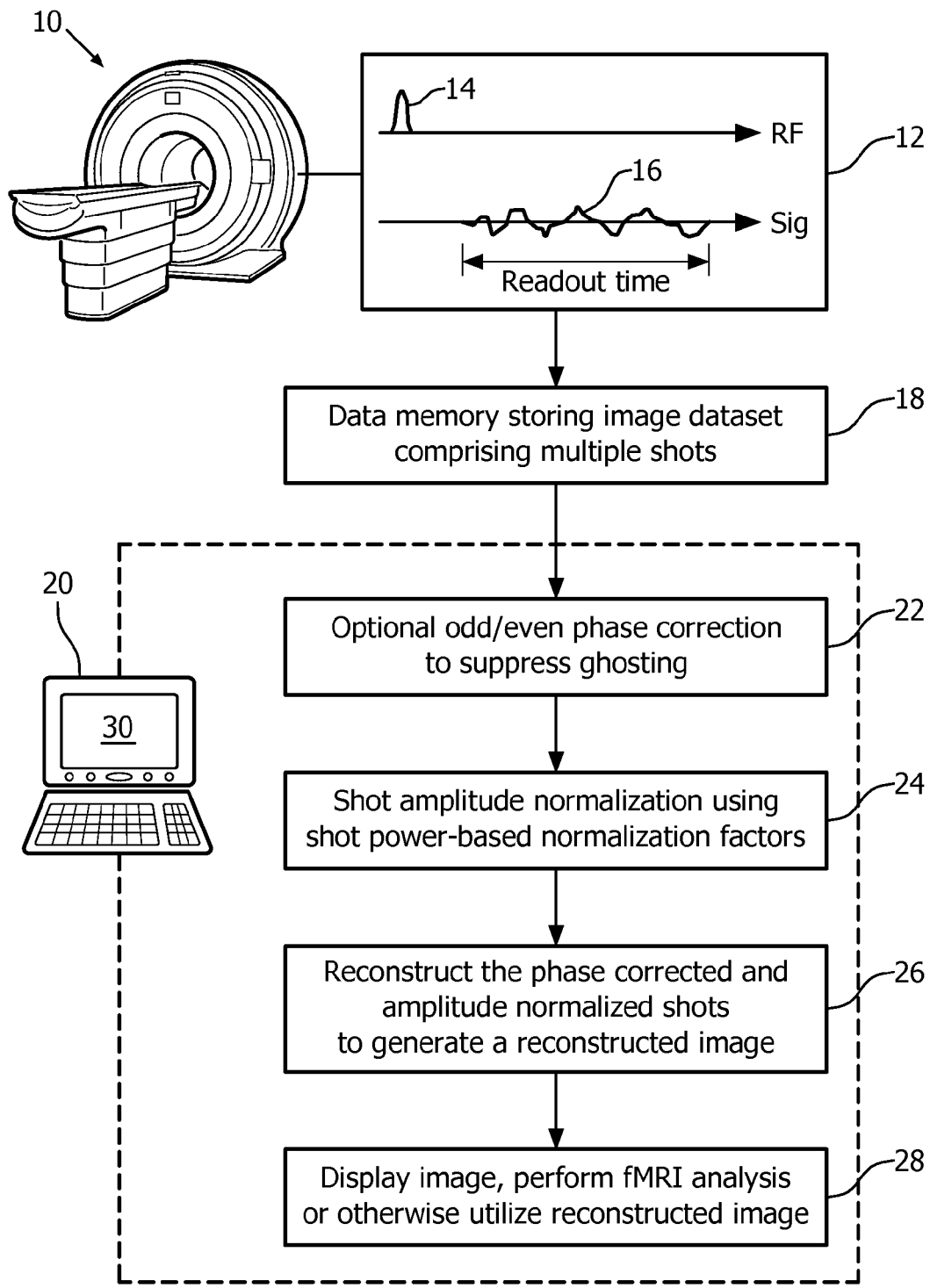

| | | |
|---|---|---|
| 6,414,487 B1 | 7/2002 | Anand et al. |
| 6,529,001 B2 | 3/2003 | Mock |
| 6,700,374 B1 | 3/2004 | Wu |
| 6,771,067 B2 * | 8/2004 | Kellman ............ G01R 33/5611 324/307 |
| 7,075,299 B1 | 7/2006 | Peters |
| 8,023,705 B2 * | 9/2011 | Weng ................. G01R 33/5615 382/128 |
| 8,170,308 B2 | 5/2012 | Fischer et al. |
| 8,938,280 B2 | 1/2015 | Harvey |
| 2005/0237057 A1 * | 10/2005 | Porter ............. G01R 33/56341 324/307 |
| 2008/0310696 A1 | 12/2008 | Hwang |
| 2010/0142786 A1 * | 6/2010 | Degani ................. A61B 5/055 382/131 |
| 2012/0161766 A1 | 6/2012 | Harvey et al. |

FOREIGN PATENT DOCUMENTS

| | | |
|---|---|---|
| JP | 2001340316 A | 12/2001 |
| WO | 02082114 A1 | 10/2002 |
| WO | 2009047690 | 4/2009 |

OTHER PUBLICATIONS

Foxall, D.L. et al "Rapid Iterative Reconstruction for Echo Planar Imaging" Magnetic Resonance in Medicine, vol. 42, No. 3, 1999, pp. 541-547.

Reeder, S.B. et al "Quantification and Reduction of Ghosting Artifacts in Interleaved Echo-Planar Imaging", Magnetic Resonance in Medicine, vol. 38, No. 3, Sep. 1997, pp. 429-439.

Kim et al "Fast Interleaved Echo-Planar Imaging with Navigator: High Resolution Anatomic and Functional Images at 4 Tesla" Magn Reson MBD Jun. 1996 35 (6) P. 895-902.

* cited by examiner

MULTIPLE SHOT MAGNETIC RESONANCE IMAGING WITH GHOSTING STABILITY CORRECTION

CROSS-REFERENCE TO PRIOR APPLICATIONS

This application is the U.S. National Phase application under 35 U.S.C. § 371 of International Application No. PCT/IB2013/056189, filed on Jul. 29, 2013, which claims the benefit of U.S. Provisional Patent Application No. 61/680,879, filed on Aug. 8, 2012. These applications are hereby incorporated by reference herein.

The following relates to the magnetic resonance imaging (MRI) arts and to applications of same such as the medical imaging arts, veterinary imaging arts, functional magnetic resonance imaging (fMRI) arts, and so forth.

In applications such as brain fMRI, a technique known as Echo Planar Imaging (EPI) is sometimes employed to acquire the image dataset. In EPI, a single radio frequency (RF) excitation pulse is applied and gradient fields are oscillated during readout in order to acquire multiple lines of k-space responsive to the single RF excitation pulse. The combination of the RF excitation pulse and the readout is referred to in the art as a "shot". The EPI technique enables rapid acquisition of a substantial number of k-space samples, and in some cases an entire image, using a single shot.

However, the acquisition possible in a single EPI shot is limited by the decay of the magnetic resonance signal excited by the RF excitation pulse. This time can be extended by applying one or more refocusing RF pulses, but nonetheless in some cases a single EPI shot is insufficient to acquire the entire image dataset. In such cases, multiple shot EPI is employed. Again, each shot corresponds to an RF excitation pulse followed by readout.

A known problem with EPI is potential introduction of phase errors. One type of phase error is phase shifts between readout lines that are read in the positive direction (i.e., using a positive magnetic field gradient) and readout lines that are read in the negative direction (i.e., using a negative magnetic field gradient). These different phase offsets for the positive and negative readout lines leads to an artifact known as ghosting. A known technique for suppressing ghosting is odd/even phase correction. See, e.g. U.S. Pat. No. 6,249,595 which is incorporated herein by reference in its entirety. The odd/even phase correction technique is suitably applied to multiple shot EPI. However, in practice some ghosting is sometimes still observed even after odd/even phase correction has been applied.

The following contemplates improved apparatuses and methods that overcome the aforementioned limitations and others.

According to one aspect, an imaging method is disclosed. An image dataset comprising multiple shots of imaging data is acquired using a magnetic resonance imaging (MRI) scanner. The signal power of each shot of the image dataset is normalized to a reference signal power to generate a power-normalized shot representation having total signal power matching the reference signal power. A reconstructed image is generated from the power normalized shot representations. The normalizing and generating operations are suitably performed by an electronic data processing device.

According to another aspect, a non-transitory storage medium stores instructions executable by an electronic data processing device to perform a method operating on an image dataset comprising N shots of imaging data acquired using an MRI scanner where N is an integer greater than one. The method includes (i) normalizing the signal power of each shot of the image dataset to generate power-normalized shot representations of the shots of the image dataset and (ii) generating a reconstructed image from the power-normalized shot representations.

According to another aspect, an apparatus comprises an electronic data processing device operating on an image dataset comprising multiple shots of imaging data acquired using an MRI scanner to perform a method including normalizing the signal power of each shot and generating a reconstructed image from the power-normalized shots. In some embodiments odd/even phase correction is performed on the image dataset before normalizing the signal power of each shot. In some embodiments the electronic data processing device operates on a dynamic series of nominally identical image datasets and the normalizing includes normalizing corresponding shots of the nominally identical image datasets having the same phase encoding to the same reference signal power, e.g. to the average total signal power of said corresponding shots.

One advantage resides in reduced image artifacts in multiple-shot magnetic resonance imaging.

Another advantage resides in reduced ghosting artifacts.

Another advantage resides in reduced shot-to-shot variability of ghosting artifacts.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging (MRI) system as disclosed herein.

Figure 2:
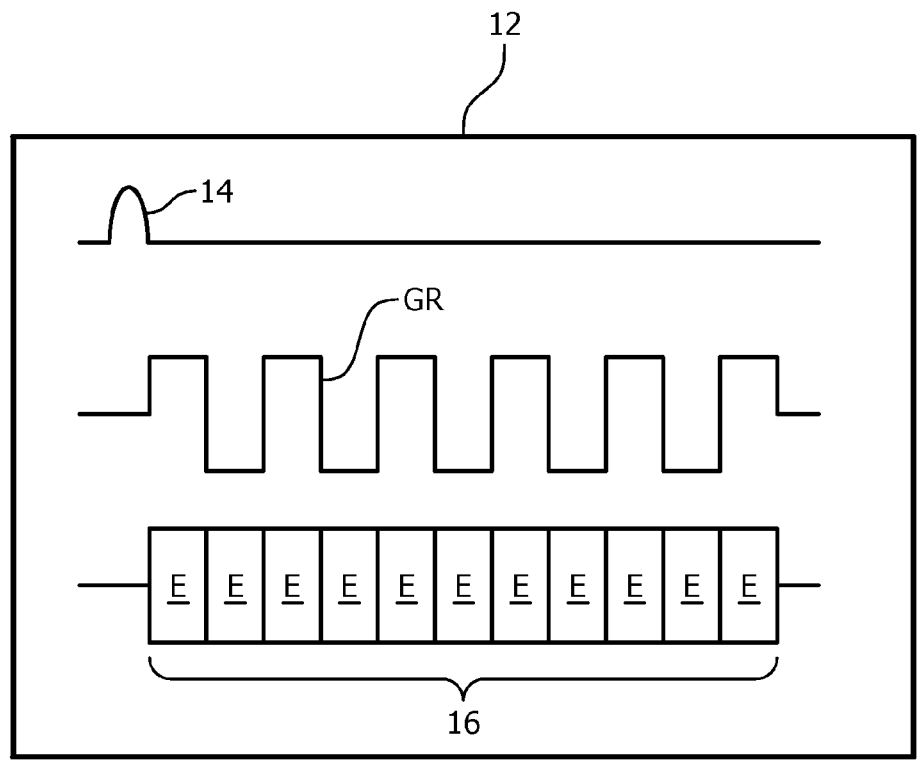

FIG. 2 diagrammatically shows an illustrative shot of an imaging dataset including the readout gradient comprising successive positive and negative gradient lobes.

Figure 3:
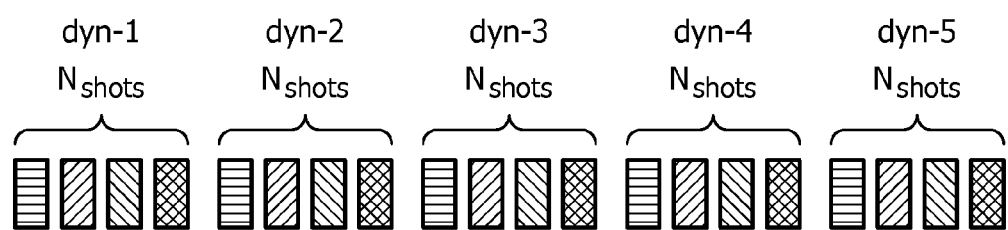

FIG. 3 diagrammatically shows a dynamic series of nominally identical images to which the disclosed image reconstruction techniques are suitably applied.

Figure 4:
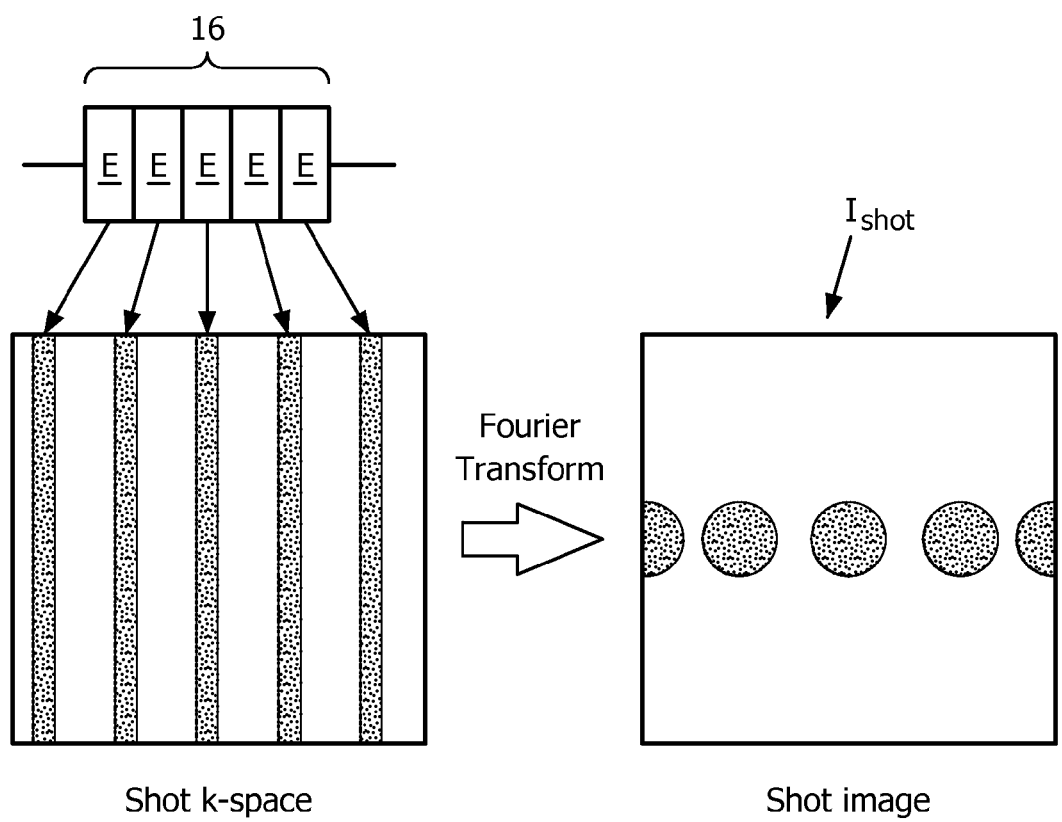

FIG. 4 diagrammatically shows construction of a shot image on which the shot normalization operation of FIG. 1 can operate in image space.

As previously discussed, Echo-Planar Imaging (EPI) is known to suffer from ghosting artifacts which can be corrected using odd/even phase correction to correct for the different phase offsets of k-space data acquired using positive and negative magnetic field gradients, respectively. In the case of multiple-shot EPI, odd/even phase correction can still be applied, but does not always provide acceptable ghost suppression.

It is recognized herein that at least a substantial portion of the ghosting observed in odd/even phase-corrected multiple-shot EPI images is attributable to shot-to-shot amplitude variation of the transmitted RF excitation. Such amplitude variation is typically assumed to be adequately suppressed via hardware-based stabilization of the transmit radio frequency (RF) amplifiers. However, it is recognized herein that even small shot-to-shot variation in the RF power can result in substantial ghosting, which moreover exhibits a high degree of instability.

Without loss of generality, an image dataset including N shots acquired by a magnetic resonance imaging (MRI) scanner is considered, where N is an integer greater than one. In general, the number of ghosts scales with N and the signals from these ghosts obscure the image. The stability of the ghosts depends on the shot-to-shot transmit stability of the RF system. In functional magnetic resonance imaging (fMRI) applications, modulation of the ghost signals can obscure or be falsely interpreted as fMRI changes. This ghosting has heretofore limited the use of multi-shot EPI in fMRI acquisition.

In view of the foregoing, it is disclosed herein to automatically correct the amplitudes of the individual shots used to acquire a multiple shot EPI image in order to both reduce ghosting levels and maintain the stability of these levels throughout an fMRI image time series. The disclosed approaches are compatible with odd/even phase correction techniques, and when applied in combination with odd/even phase correction further improves image quality and long term time stability. The disclosed amplitude correction can be performed without any pre-calibration, and the amplitude correction is applied on a per-image basis (or, equivalently, on a per-image dataset basis). It is readily implemented during image reconstruction by adding calculations to (1) evaluate the total signal power of each shot in the multi-shot EPI image dataset and (2) scale the imaging data for each shot using a shot-specific normalization factor. This eliminates the effects of shot-to-shot signal level variations and eliminates the ghosting and ghosting fluctuations caused by small performance variations in the transmit subsystem.

When considering a single multi-shot image, the signal power for each shot will in general be different, because each shot is phased encoded differently. The shots within the image are related only by the distribution of signal in the object being imaged, but a priori the relation between the signal power in the different shots that make up a single image is difficult to estimate. However, it is recognized herein that if a dynamic series of multi-shot images is acquired in which the images of the dynamic series are nominally identical, then the signal power in each corresponding shot should be the same across all images of the dynamic series, and the signal power in those corresponding shots can be normalized. Acquisition of a dynamic series of nominally identical images is performed, for example, in fMRI applications in which one dynamic series of images is acquired without perturbation (e.g., baseline images) and another dynamic series of images is acquired with perturbation. (Note that various acquisition interleaving may be performed, e.g. the acquisition may be unperturbed image/perturbed image/unperturbed image/ . . . . ) In this example, the set of unperturbed images forms a first dynamic series of nominally identical images, and the set of perturbed images forms a second dynamic series of nominally identical images.

Although described in conjunction with multi-shot EPI acquisition for fMRI applications, it is to be appreciated that the disclosed approaches are readily and usefully applied to multi-shot EPI for any application, and moreover is readily and usefully applied to multi-shot MRI acquisition generally.

With reference to FIG. 1, an illustrative magnetic resonance imaging (MRI) system includes an MRI scanner 10 configured to acquire an image dataset comprising multiple shots of imaging data. The MRI scanner 10 can be any type of commercial or non-commercial MRI scanner, such as (by way of illustrative example) an Achieva™, Ingenia™ Intera™, or Panorama™ MRI scanner (available from Koninklijke Philips Electronics N.V., Eindhoven, The Netherlands). Without loss of generality, an image dataset including N shots acquired by the MRI scanner 10 is considered, where the parameter N is an integer greater than one. In FIG. 1, a diagrammatic block 12 diagrammatically illustrates one shot including a transmitted radio frequency (RF) excitation 14 (which may more generally be an RF pulse packet rather than a single pulse as depicted in block 12) and a readout 16 of magnetic resonance generated in an imaging subject by the RF excitation 14. Not shown in diagrammatic block 12 are other typical components of the pulse sequence making up the shot, such as a slice-selective magnetic field gradient applied in conjunction with the RF excitation 14 and one or more oscillatory magnetic field gradients applied during the readout 16 (in the case of an EPI shot). The diagrammatic block 12 shows a single shot; again, the multi-shot image dataset includes multiple (i.e., two or more) shots, e.g. N shots. The acquired image dataset comprising N shots is suitably stored in a buffer or memory 18. The process can be repeated (possibly in interleaved fashion) to acquire one or more dynamic series of multi-shot images. As used herein, the multi-shot images in a dynamic series of images are nominally identical; however, in practice the RF excitation power may vary from shot-to-shot both for the shots within a single multi-shot image and for shots in different images of the dynamic series.

The multi-shot image dataset is processed by an electronic data processing device 20, such as a suitably programmed illustrative computer, a network based server, or so forth. In some embodiments analog or mixed circuitry may also be included, e.g. parallel reconstruction pipeline hardware optionally used in performing Fourier transform reconstruction. The disclosed image processing techniques can also be embodied as a non-transitory storage medium (not shown) such as a hard disk or other magnetic storage medium, optical disk or other optical storage medium, random access memory (RAM), flash memory or other electronic storage medium, or so forth, which stores instructions that are executable by the electronic data processing device 20 to perform the disclosed image processing.

With continuing reference to FIG. 1 and with further reference to FIG. 2, the electronic data processing device 20 performs optional odd/even phase correction 22 to suppress ghosting. Some illustrative examples of odd/even phase correction 22 are described, for example, in U.S. Pat. No. 6,249,595 which is incorporated herein by reference in its entirety. Briefly, as diagrammatically shown in FIG. 2 a single shot of an EPI sequence applies a readout gradient GR comprising successive positive and negative gradient lobes, and readout data (sometimes called an echo EC) is acquired during each gradient lobe. The odd/even phase correction 22 corrects for the difference in phase offsets of k-space data acquired during applied positive magnetic field gradients and k-space data acquired during applied negative magnetic field gradients. The optional odd/even correction 22 is performed on a per-shot basis without reference to other shots.

The electronic data processing device 20 performs shot amplitude normalization in an operation 24. As already noted, the average signal power of the shots within a single multi-echo image dataset is recognized herein to be a generally poor basis for developing the normalization factors for the amplitude normalization 20, because each shot is phased encoded differently and the signal power of the shots making up a single multi-shot image are generally not expected to have any readily discernible relationship. However, when a dynamic series of nominally identical images are acquired, then corresponding shots across the images of the dynamic series provides a rational basis for signal power normalization, as described in the following.

With reference back to FIG. 2, and without loss of generality, each shot of data comprises $N_{echo}$ echoes of $N_{point}$ complex data points per echo. The signal power for the shot is calculated as the sum of the modulus of all complex data points in a given shot. If data(p,e) is the complex data value labeled by point (p) and echo (e), then the total signal power in the shot, denoted herein as S(shot), is then given by:

$$S(\text{shot}) = \sum_{e=1}^{e=N_{echo}} \sum_{p=1}^{p=Npoint} |\text{data}(p, e)|^2$$

With reference to FIG. 3, a (single) image dataset is acquired by repeating the shot sequence of FIG. 2 $N_{shot}$ times with generally different phase encode conditions for each shot. to form an images. To generate a dynamic series of nominally identical images, this is repeated for each image of the dynamic series. This is diagrammatically shown in FIG. 3, where each image is referred to as a dynamic image (or simply as a "dynamic" for short). FIG. 3 shows EPI acquisition of a dynamic series of five nominally identical images denoted dyn-1 through dyn-5. In FIG. 3, the data from individual shots is indicated by blocks with different crosshatchings. Blocks with the same crosshatch pattern indicate shots acquired with the same phase encoding conditions, while blocks with different crosshatch patterns indicate shots acquired with (generally) different phase encoding conditions. As shown in FIG. 3, groups of $N_{shot}$ data blocks taken together form the raw data for one dynamic image and the collection of successive images forms the time series (i.e. dynamic series). Note the images need not in general be acquired at evenly spaced time points, and moreover it is contemplated to interleave shots of different dynamic images.

Without loss of generality, total signal power measurements of shot data sets in the dynamic series are indexed herein using a shot index denoted shot and by a dynamic (image) index denoted dyn. For example, using this notation the signal power for shot 2 of dynamic image 3 (dyn-3) of FIG. 3 is denoted S(2,3), and more generally the signal power of shot in dynamic image dyn is denoted by S(shot, dyn).

The images of the dynamic series are assumed to be identical. In practice, however, shot-to-shot variation in the tip angle of RF pulse 14 (see FIG. 2) caused by fluctuations in the RF amplifier of the MR scanner may in general cause shot-to-shot signal variations and contribute to ghosting in each image and to variable ghosting amplitudes from dynamic image to dynamic image. The shot amplitude normalization operation 24 (see FIG. 1) reduces or eliminates this ghosting component.

Because the different shots of a single dynamic image employ different phase encoding conditions, it is not expected that the signal power of the different shots making up a single dynamic image will be similar. In other words, in general $S(s_x,dyn) \neq S(s_y,dyn)$ for a given image dyn and different shots $s \neq s_y$. However, for a dynamic series of nominally identical images, it should ideally hold that $S(s, d_x)=S(s,d_y)$ for corresponding shots s of two different dynamic images $d_x \neq d_y$ of the series. Here, "corresponding shots" denote shots acquired with the same phase encode condition.

In practice, however, the signal power S(s,d) of the collection of corresponding shots s for different dynamic images d acquired with the same phase encode condition will vary as a function of the dynamic image d, because of shot-to-shot RF amplifier fluctuations. The observation that this collection of corresponding shots across dynamic images ideally should have the same signal power but generally do not due to RF amplifier fluctuations makes this collection of corresponding shots a suitable basis for generating an appropriate amplitude normalization factor for these shots.

In one approach, an average signal power $\langle S(\text{shot}) \rangle$ over all data sets is computed according to:

$$\langle S(\text{shot}) \rangle = \left(\frac{1}{N_{dynamic}}\right) \sum_{d=1}^{d=N_{dynamic}} S(\text{shot}, d)$$

where $N_{dynamic}$ denotes the total number of dynamic images in the dynamic series (e.g., five images in the illustrative dynamic series of FIG. 3). In the above equation, the notation shot indicates a shot of a given phase encode condition, and the summation is over all corresponding shots shot having that given phase encode condition.

The signal fluctuations caused by the power amplifier are corrected by the shot amplitude normalization operation 24 (FIG. 1) by normalizing the signal power from the individual shots in a collection of corresponding shots to the average signal power for that collection of corresponding shots. In one embodiment, the normalization coefficient for signal power is suitably given by:

$$\alpha(\text{shot}, \text{dyn}) = \frac{\langle S(\text{shot}) \rangle}{S(\text{shot}, \text{dyn})}$$

The complex raw data points in any shot taken from the dynamic series can then be amplitude corrected by multiplying them by: F(shot,dyn) given by:

$$F(\text{shot},\text{dyn}) = \sqrt{\alpha(\text{shot},\text{dyn})}$$

In this last equation, the square root appears in the normalization equation because signal power is formed from the square of the signal amplitude.

In the foregoing embodiment, the normalization is with respect to the average signal power $\langle S(\text{shot}) \rangle$ over the collection of all corresponding shots shot in all $N_{dynamic}$ data sets. More generally, for a collection of corresponding shots shot, the quantity with respect to which the normalization is performed can be denoted as a reference signal power $S_{ref}$(shot). The normalization forces the total signal power of the normalized shot to match the reference signal power $S_{ref}$. For the above example, $S_{ref}(\text{shot}) = \langle S(\text{shot}) \rangle$ and the normalization coefficient can be written as:

$$\alpha(\text{shot}, \text{dyn}) = \frac{S_{ref}(\text{shot})}{S(\text{shot}, \text{dyn})}$$

In alternative embodiments, a quantity other than <S(shot)> may be chosen as the reference signal power $S_{ref}$(shot).

For example, in one alternative a specific dynamic image $D_{ref}$ in the dynamic series is selected as a reference image, and $S_{ref}(\text{shot})=S(\text{shot}, D_{ref})$ is used as the reference signal power. In this embodiment all the images are scaled to the signal power found in the reference dynamic $D_{ref}$, which may be selected as the first acquired dynamic image, the last acquired dynamic image, a dynamic image with the lowest ghosting, or so forth.

In another embodiment, the raw data across the time series is averaged so as to have signal averaged complex data sets for each collection of corresponding shots: <data (p,e)> and then compute the reference power $S_{ref}(\text{shot})$ as:

$$S_{ref}(\text{shot}) = \sum_{e=1}^{e=N_{echo}} \sum_{p=1}^{p=Npoint} |\langle\text{data}(p, e)\rangle|^2$$

In this approach the images are all scaled according to the average complex image for the time series.

Another embodiment is to use the signal power of the k-space lines derived from another image of the subject made with equivalent resolution and contrast to estimate reference $S_{ref}(\text{shot})$ values for all collections of corresponding shots. For multiple shot EPI such an image can be made using a fast field echo (FFE) method. This entails selecting the k-space lines of each encoded in the multi shot EPI method and treating them in the same fashion as the echoes recorded in the EPI shot.

One way to visualize the foregoing is as follows. Consider the echoes from each single shot (after phase correction for odd/even echo differences) being placed separately into a pre-zeroed matrix (i.e., a zero-padded matrix) to form an under-sampled shot k-space. When Fourier reconstruction is performed on such the under-sampled shot k-space the result is the main image and a series of separate ghosts of equal intensity to the main image all at different offsets from the main image because of the under-sampling. This under-sampled image is referred to herein as a "shot image". If the shots are all excited by exactly the same RF transmit power, then when the under-sampled shot images are added together it follows that all the ghosts would cancel exactly and leave only the main image because the combination of the undersampled shot images is not under-sampled.

However, this cancellation depends upon each under-sampled k-space having the correct intensity and the ghosts having the correct phase to cancel. The standard phase correction applied to the odd and even echoes addresses the phase issues in the data, but not the issues related to shot-to-shot variations in the signal amplitude.

As the undersampled shot images are added together in the perfect case (i.e., assuming perfect odd/even phase correction and equal transmit RF power for all shots), a contribution of (1/N) is added to the signal intensity of the main image for each added shot image. Each ghost copy also receives a contribution of (1/N) of the main image signal intensity from each shot—but, the phases of the ghosts in the under-sampled shot images are different. These phases shift by $2\pi k/N$ radians depending on the shot and, in the perfect case, leads to complete cancellation in the combined complex image.

The Parseval-Rayleigh theorem states that the signal power measured in the k-space domain and the signal power measured in the image domain should be equal. In the perfect reconstruction case it follows that the signal power in each under-sampled shot k-space and the signal power in the corresponding under-sampled shot image should also be equal so that the ghosts all cancel. The amplitude scaling or normalization procedure set forth herein forces this condition on the imperfect data to improve ghost cancellation.

The foregoing analysis is for a single magnetic resonance receive coil. For embodiments employing multiple receive channels where each shot is received on all receive channels, the method can be applied on a channel-by-channel basis before the complex channel data are combined. The EPI data can also be acquired using half-scan or partial k-space methods, with the disclosed amplitude normalization being applied to the data from the separate shots in such a scan. The image dataset can also be collected with a multiple channel receiver coil in a parallel imaging mode using a procedure such as SENSE or GRAPPA. Again the disclosed scaling of the separate shots to correct for shot-to-shot power variation can be applied before applying these methods.

Still further, the approach is compatible with the use of multiple transmit channels for exciting the magnetic resonance signal. Such multi-transmit channel arrangements are less stable than coils with signal transmit channels because each RF amplifier adds its own instability to the separate transmit channels.

The illustrative examples pertain to EPI acquisition; however, the amplitude normalization method can be applied to any multi-shot magnetic resonance acquisition sequence that collects interleaved k-space data using multiple shots, such as multi-shot spiral, GRAZE, TSE, and radial scans. All these types of multi-shot sequences can suffer from shot-to-shot variation of signal intensity, which can create artifacts. The amplitude scaling procedure disclosed herein reduces the severity of such artifacts and improves the consistency of the images during a dynamic scan.

With reference back to FIG. 1, the output of the shot amplitude normalization operation 24 are (optionally phase-corrected and) amplitude-normalized shots. In an operation 26, the electronic data processing device 20 performs image reconstruction for the data set making up each dynamic image (e.g. in the case of FIG. 3 reconstructing data set dyn-1 to make a first image, reconstructing data set dyn-2 to make a second image, and so forth to generate a dynamic series of reconstructed images with reduced ghosting both within images and across the dynamic series. In an operation 28, the electronic data processing device 20 displays the reconstructed images on a display device 30 (e.g., LCD display of the illustrative computer 20), performs fMRI analysis, or otherwise utilizes the reconstructed image.

In fMRI applications, multiple time series of image datasets are acquired. For example, some fMRI applications involve acquiring a first dynamic series of images in the presence of a stimulus or perturbation, and acquiring a second (e.g., baseline) dynamic series of images in the absence of the stimulus or perturbation. The stimulated images are presumed to be all identical (i.e., forming one dynamic series) and the non-stimulated images are also presumed to be identical (i.e., forming another dynamic series). However, there is expected to be some difference between the stimulated images and the non-stimulated images, and it is this difference that the fMRI procedure is intended to image or otherwise probe. In some suitable processing approaches, the odd/even phase correction 22 is performed for all shots, and then the amplitude normalization operation 24 is performed separately for the stimulated dynamic series of images and for the non-stimulated dynamic series of images. After the image reconstruction operation 26, the processing 28 may, for example, entail computing a subtraction image in which a stimulated image generated from the stimulated dynamic series is subtracted from an unstimulated image generated from the non-stimulated dynamic series (or vice versa) and/or quantitative differences are computed.

The previously described embodiments of the shot amplitude normalization operation 24 operate in k-space. However, it is also contemplated to perform the shot amplitude normalization in image space.

With reference to FIG. 4, the echoes E from each single shot readout 16 (after phase correction for odd/even echo differences) can be placed separately into a pre-zeroed matrix (i.e., a zero-padded matrix) to form an under-sampled shot k-space which can then be Fourier transformed into image space to generate a shot image $I_{shot}$. The shot images are ghosted because they are intrinsically under-sampled. The under-sampling pattern is generally not simple, and the ghosting pattern typically has many overlapping ghosts.

Each shot image $I_{shot}$ corresponds to a shot. Thus, in analogy to the previous notation referring to a shot index shot and a dynamic image index dyn, the shot image can be indexed $I_{shot}(shot,dyn)$, and if all the individual shot images for one dynamic image are summed together the intrinsic under-sampling is removed. In other words, the dynamic image dyn can be represented as:

$$I_{dyn} = \sum_{i=1}^{N_{shots}} I_{shot}(i, \text{dyn})$$

Any ghosting that remains after this shot image summation is caused either by odd-even echo differences or shot-to-shot signal level changes. The odd-even echo differences can be resolved by applying a phase correction, e.g. multiplication of image lines by a complex phase factor. This corrects ghosting due to phase mismatch between odd-even echoes, but has no effect on the signal power of the data, or on shot-to-shot signal level changes.

The shot-to-shot signal level changes can be resolved by the shot amplitude normalization operation 24 operating in image space (i.e., on the shot images) for a time series of images using a signal power normalization of the shot images $I_{shot}$ before they are combined by the shot image summation to make the complete image for each dynamic. In the dynamic EPI time series, there will be $N_{shot}$ images for each of the $N_{dynamics}$ dynamic images in the dynamic series. The signal power of a complex shot image: I(shot,dyn,x,y) with $N_x \times N_y$ pixels can be defined as:

$$S(\text{shot, dyn}) = \sum_{x=1}^{x=N_x} \sum_{y=1}^{y=N_y} |I(\text{shot, dyn}, x, y)|^2$$

where the double-summation computes the sum of the squares of the modulus of all (complex) pixel values of each shot image. With this definition of signal power in the image domain, $\alpha$(shot,dyn) and F(shot,dyn) can be calculated and the normalization correction applied to the shot images. Parseval's Theorem provides the requisite equality relationship between the image domain and time domain measures of signal power.

Similar strategies can be applied to estimate other $S_{ref}$(shot) value embodiments in the image domain, for example by averaging signal power for the corresponding shot images over the time series, picking the signal power for the corresponding shot from one dynamic from the series, or taking the signal power of the complex shot images averaged across the time series. The $S_{ref}$(shot) can also be calculated from raw data acquired with another non-ghosted method such as fast field echo (FFE) with selected k-space lines replacing the individual echoes of the raw shot data. These could be manipulated to form under-sampled shot images and Sref(shot) values calculated.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. An imaging method comprising:
   acquiring a dynamic series of nominally identical dynamic image datasets, each image dataset comprising multiple shots of imaging data acquired using a magnetic resonance imaging (MRI) scanner;
   normalizing the signal power of each shot of an image dataset of the image datasets to a reference signal power to generate a power-normalized shot representation having total signal power matching the reference signal power; and
   generating a reconstructed image from the power-normalized shot representations;
   wherein the normalizing and generating are performed by an electronic data processing device.

2. The imaging method of claim 1, wherein the normalizing comprises:
   computing an initial total signal power for each shot of the image dataset;
   computing a scaling factor for each shot based on comparison of the initial total signal power computed for the shot and the reference signal power; and
   scaling the signal power of each shot of the image dataset using the scaling factor for the shot to generate the power-normalized shot representation.

3. The imaging method of claim 2, wherein
   the reference signal power for each shot of the image dataset is computed as an average of the initial total signal power for the shot and the initial signal power for all corresponding shots of the other dynamic image data sets of the dynamic series.

4. The imaging method of claim 1, wherein:
   the normalizing includes:
   zero-padding each shot to form a full dataset for the shot;
   reconstructing the full dataset for each shot to generate a shot image for each shot,
   computing an initial total signal power for each shot image by summing the squares of the modulus of all pixel values of the shot image,
   computing a scaling factor for each shot image based on comparison of the initial total signal power computed for the shot image and a reference signal power;
   scaling the pixel intensities of each shot image using the scaling factor for the shot image to generate the power-normalized representations as power-normalized shot images; and
   the generating includes combining the power-normalized shot images to generate the reconstructed image.

5. The imaging method of claim 4, wherein the normalizing further comprises:

computing the reference signal power for each shot image as an average of the initial total signal power for the shot image and the initial signal power for all corresponding shot images of the other image data sets of the dynamic series.

6. The imaging method of claim 1, further comprising: performing odd/even phase correction on the image dataset.

7. The imaging method of claim 6, further comprising generating a corresponding time series of reconstructed images corresponding to the other image data sets, wherein:
the normalizing comprises normalizing corresponding shots of the image datasets that have the same phase encoding to the same reference signal power; and
the odd/even phase correction is performed before the normalizing.

8. The imaging method of claim 7, wherein the acquiring the dynamic series of nominally identical dynamic image datasets comprises separately acquiring a dynamic series of nominally identical perturbed images and for a dynamic series of nominally identical unperturbed images to generate reconstructed perturbed images and reconstructed unperturbed images, respectively, and the method further comprises:
performing (28) functional magnetic resonance imaging (fMRI) analysis comparing the reconstructed perturbed images and the reconstructed unperturbed images.

9. The imaging method of claim 1, wherein the image dataset comprises multiple Echo-Planar Imaging (EPI) shots of imaging data.

10. A non-transitory storage medium storing instructions executable by an electronic data processing device to perform a method operating on an image dataset comprising N shots of imaging data acquired using a magnetic resonance imaging (MRI) scanner where N is an integer greater than one, the method including (i) controlling acquisition of a dynamic series of nominally identical dynamic image datasets, including the image dataset comprising N shots; (ii) determining normalization of the signal power of each shot of the image dataset to a reference signal power to generate power-normalized shot representations of the shots of the image dataset and (iii) generating a reconstructed image from the power-normalized shot representations.

11. The non-transitory storage medium of claim 10, wherein the normalizing operation (ii) comprises normalizing corresponding shots of all image datasets having the same phase encoding to the same reference signal power.

12. The non-transitory storage medium of claim 11, wherein the reference signal power for normalizing corresponding shots of the image datasets having the same phase encoding is the average total signal power of the corresponding shots.

13. The non-transitory storage medium of claim 11, wherein the normalizing operation (ii) is performed in image space operating on shot images wherein the $k^{th}$ shot image is generated by reconstructing the $k^{th}$ shot with zero-padding.

14. The non-transitory storage medium of claim 13, wherein the generating operation (iii) comprises summing the shot images after performing the normalizing operation (ii).

15. The non-transitory storage medium of claim 10, wherein the method further includes (iv) performing odd/even phase correction (22) on the image dataset.

16. The non-transitory storage medium of claim 10, wherein the image dataset comprises N Echo-Planar Imaging (EPI) shots of imaging data.

17. An apparatus comprising:
an electronic data processing device; operating on a dynamic series of nominally identical image datasets, each image dataset comprising multiple shots of imaging data acquired using a magnetic resonance imaging (MRI) scanner, configured to perform a method including acquiring the image datasets, normalizing the signal power of each shot of the image data sets to a reference signal power and generating a reconstructed image from the power-normalized shots.

18. The apparatus of claim 17, wherein the method performed by the electronic data processing device further includes performing odd/even phase correction on the image datasets.

19. The apparatus of claim 18, wherein the odd/even phase correction is performed before normalizing the signal power of each shot.

20. The apparatus of claim 17, wherein the normalizing includes normalizing corresponding shots of the nominally identical image datasets having the same phase encoding to the same reference signal power.

21. The apparatus of claim 20, wherein the reference signal power to which corresponding shots of the nominally identical image datasets having the same phase encoding are normalized is the average total signal power of said corresponding shots.

* * * * *